(12) United States Patent
Gaynor

(10) Patent No.: US 11,722,114 B2
(45) Date of Patent: *Aug. 8, 2023

(54) INTERDIGITATED RF FILTER

(71) Applicant: pSemi Corporation, San Diego, CA (US)

(72) Inventor: Michael P. Gaynor, Crystal Lake, IL (US)

(73) Assignee: PSEMI CORPORATION, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/723,341

(22) Filed: Apr. 18, 2022

(65) Prior Publication Data
US 2022/0294412 A1 Sep. 15, 2022

Related U.S. Application Data

(63) Continuation of application No. 16/863,083, filed on Apr. 30, 2020, now Pat. No. 11,316,491.

(51) Int. Cl.
*H03H 7/01* (2006.01)
*H03H 9/02* (2006.01)

(52) U.S. Cl.
CPC ............ *H03H 7/0161* (2013.01); *H03H 7/17* (2013.01); *H03H 9/02228* (2013.01)

(58) Field of Classification Search
CPC ..... H03H 9/02228; H03H 7/17; H03H 7/0115
USPC .................................................. 333/186, 187
See application file for complete search history.

(56) References Cited

U.S. PATENT DOCUMENTS

| 5,621,364 | A | * | 4/1997 | Ruile | H03H 9/643 |
| | | | | | 310/313 C |
| 11,316,491 | B2 | * | 4/2022 | Gaynor | H01L 23/66 |
| 2006/0255884 | A1 | * | 11/2006 | Tanaka | H03H 9/02842 |
| | | | | | 333/195 |
| 2008/0238576 | A1 | * | 10/2008 | Takahashi | H03H 9/14544 |
| | | | | | 333/195 |
| 2009/0273408 | A1 | * | 11/2009 | Inoue | H03H 9/725 |
| | | | | | 716/132 |
| 2021/0344319 | A1 | | 11/2021 | Gaynor | |

* cited by examiner

*Primary Examiner* — Rakesh B Patel
(74) *Attorney, Agent, or Firm* — Steinfl + Bruno LLP

(57) ABSTRACT

An interdigitated RF filter. The interdigitated RF filter includes input fingers connected to an input node and output fingers connected to an output node where at least one input finger is connected the output node or at least one output finger is connected to the input node. The described interdigitated RF filter can be implemented in various configurations such as series, shunt, ladder or a combination thereof.

15 Claims, 9 Drawing Sheets

INTERDIGITATED RF FILTER

CROSS-REFERENCE TO RELATED APPLICATIONS

The present application is a continuation of U.S. patent application Ser. No. 16/863,083, filed Apr. 30, 2020, titled "Interdigitated RF Filter," now U.S. Pat. No. 11,316,491 issued Apr. 26, 2022, which is herein incorporated by reference in its entirety.

TECHNICAL FIELD

The present teachings generally relate to electronic circuits, and more specifically to apparatus and method for control of roll off of interdigitated radio frequency (RF) filters.

BACKGROUND

Generally, in RF circuits and applications, there is a need for small low loss filters with sharp roll off to handle RF power. The frequency response of RF filters may degrade due to parasitics. These parasitics cause the insertion loss of the filter to decrease at higher frequencies, thus reducing the selectivity of the filter at those frequencies. The reduction of insertion loss at higher frequencies is also referred to as flyback. Historically RF filters are fairly large because they are built with passive components which consume a lot of space. Since space if often correlated with cost, small size may be desired for low cost solutions.

Accordingly, there is a need for method and apparatus for control of roll off of RF filters. The control of roll off of an RF filter would enable the RF filter to exhibit better flyback performance.

SUMMARY

Various embodiments of apparatus and method and for control of roll off of interdigitated RF filters are disclosed.

According to a first aspect of the present disclosure, a radio frequency (RF) interdigitated RF filter is provided, comprising: a plurality of input fingers connected to an input node; and a plurality of output fingers connected to an output node, wherein at least one output finger is connected to the input node, and/or at least one input finger is connected to the output node.

According to a second aspect of the present disclosure, a method of filtering a signal is disclosed, comprising: providing, between an input node and an output one, an electronic structure by interleaving a plurality of input fingers connected to the input node with a plurality of output fingers connected with the output node; connecting at least one output finger to the input node or at least one input finger the output node; and applying the signal at the input node, thereby filtering the signal to generate a filtered signal at the output node.

Further aspects of the disclosure are shown in the specification, claims and drawings of the present application.

BRIEF DESCRIPTION OF THE DRAWINGS

The disclosed apparatus, in accordance with one or more various embodiments, are described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

Like reference numbers and designations in the various drawings indicate like elements.

DETAILED DESCRIPTION

Figure 2:
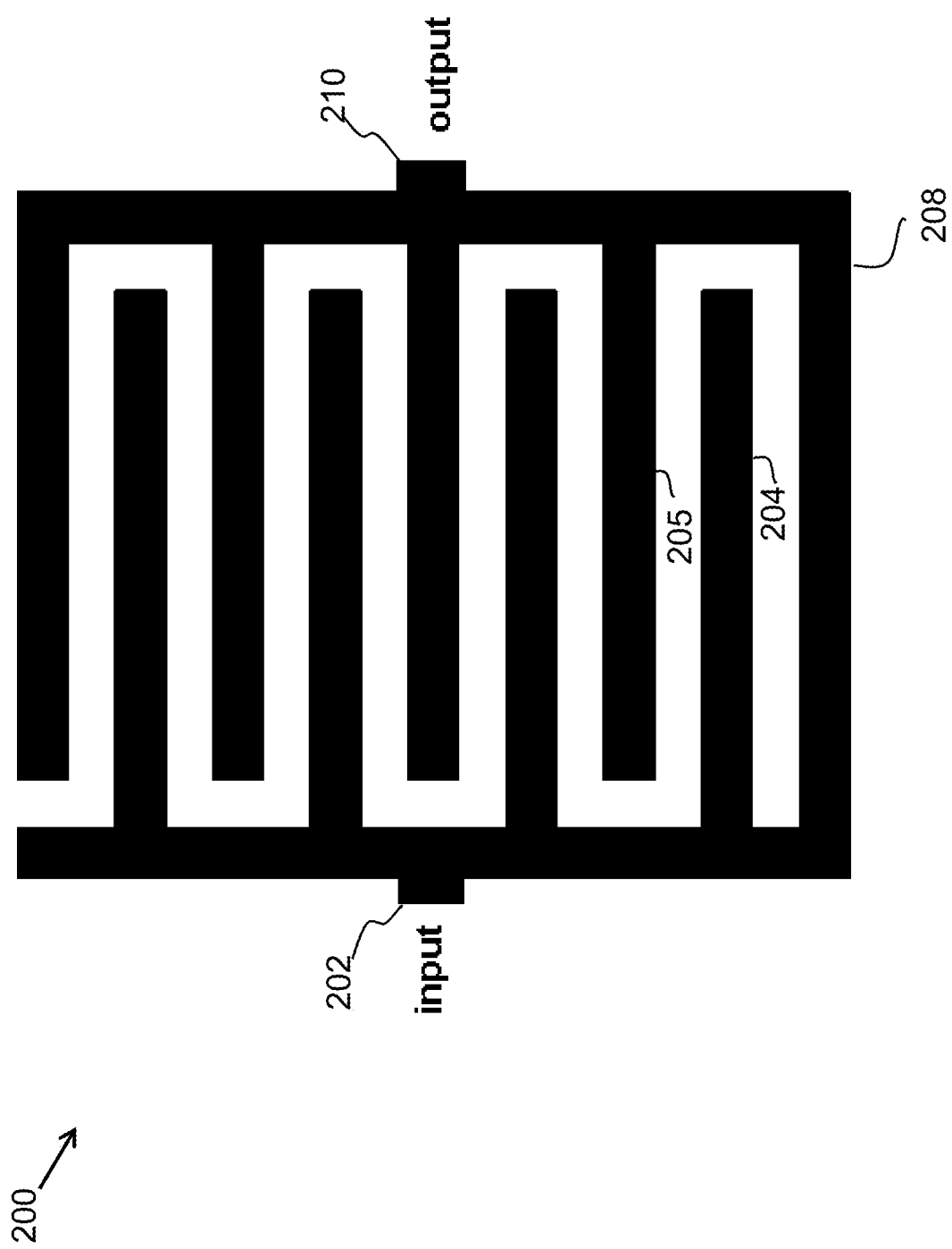
FIG. 2 shows a first exemplary layout of an interdigitated RF filter 200 according to the present disclosure, where one output finger has been directly connected (shorted) to the input.

Throughout this document the term "input node" is used to refer to a section of an interdigitated RF filter including input fingers (see for example FIG. 2). The "input node" connects an input of the interdigitated RF filter to the input fingers. The term "output node" is used to refer to a section of an interdigitated RF filter including output fingers (see for example FIG. 2). The "output node" connects an output of the interdigitated RF filter to the output fingers. The term "node" is used to refer to a section of an interdigitated RF filter including input and output fingers. The "node" is connected to both an input and an output of interdigitated RF filter.

Figure 1:
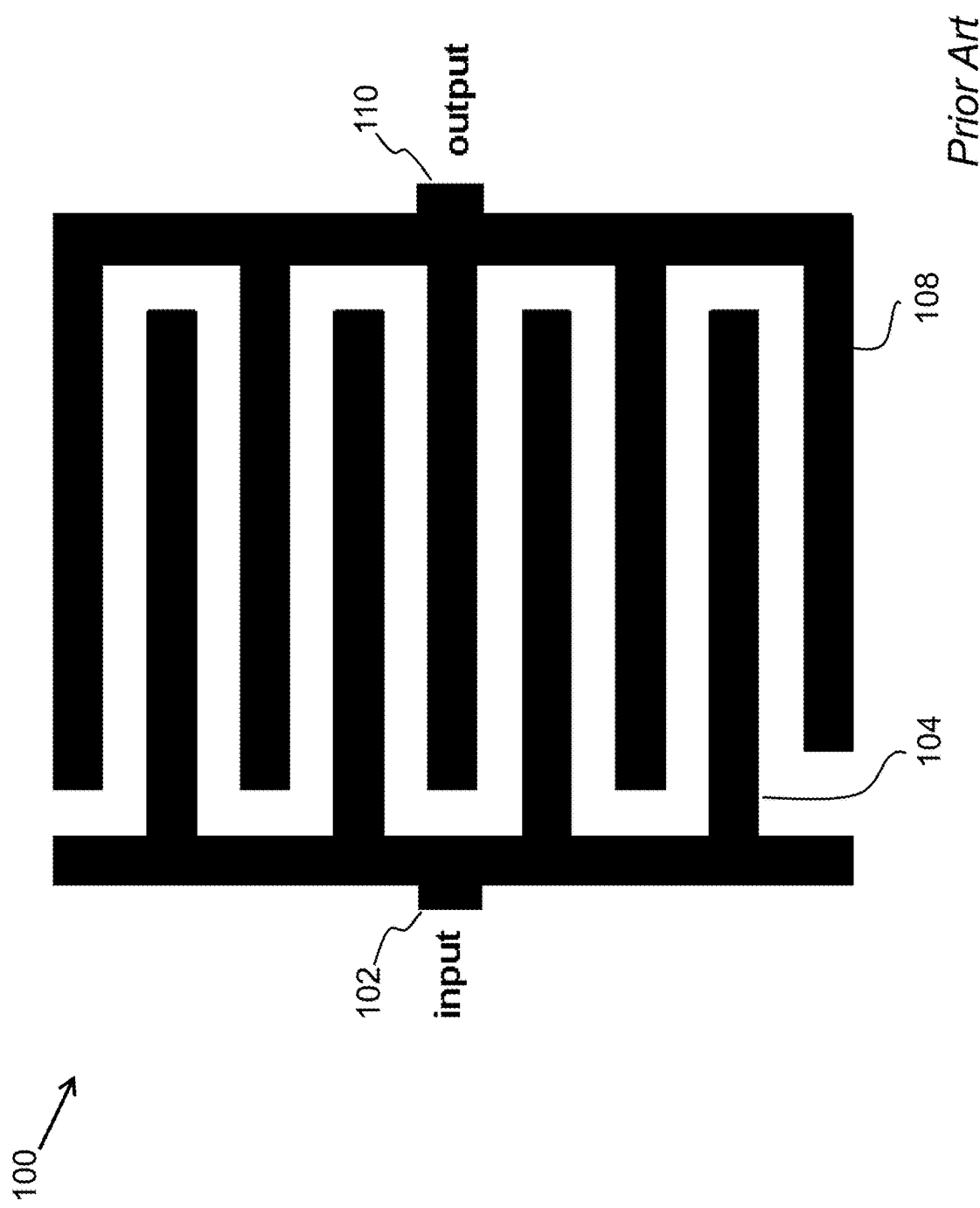
FIG. 1 shows a schematic of a prior art interdigitated capacitor 100 which can be employed as a component in an RF filter.

FIG. 1 shows a layout of a prior art interdigitated capacitor 100 also referred to as a Metal Oxide Metal capacitor or MOM capacitor which can be employed as a component in an RF filter. This capacitor has an input 102 and an output 110. This interdigitated capacitor has several fingers connected to the input 102, for example, four fingers as shown. Several fingers are connected to the output 110, for example, five fingers as shown. As an example, an input connected finger is indicated by reference number 104 and an output connected finger is indicated by reference number 108. One drawback of prior art RF filters using interdigitated capacitors and inductors is that they suffer from flyback phenomenon. They also tend to be large, as the interdigitated capacitor of FIG. 1 would be one of several components in the filter, which may include more of these capacitors as well as inductors which tend to be even larger than capacitors.

The RF interdigitated RF filter according to the present disclosure provides solutions to the problem of flyback phenomenon in interdigitated RF filters, while providing low loss and sharp roll off of the RF characteristics.

FIG. 2 shows a first exemplary layout of an interdigitated RF filter 200 according to the present disclosure, where one output finger 208 has been connected to the input. This interdigitated RF filter has an input node 202 and an output node 210. This interdigitated RF filter has several fingers connected to the input 202, and several fingers connected to the output 210. As an example, an input connected finger is indicated by reference number 204 and an output connected finger is indicated by reference number 208. As a further example, another output finger is indicated by reference number 205.

The direct connection of the bottom finger 208 of the output to the input causes the interdigitated RF filter to have a roll off characteristic as a function of frequency where the roll of is sharp and there is very little flyback. The structure acts as a lowpass filter.

Figure 3:
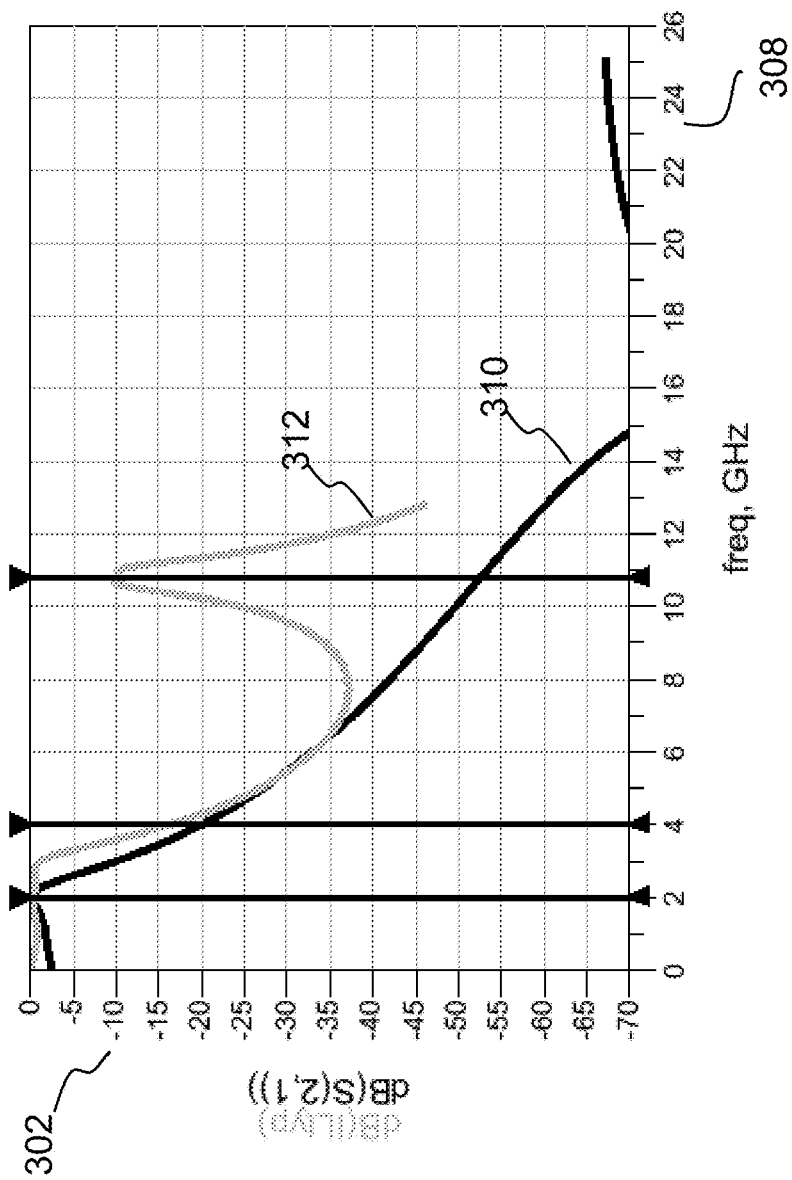
FIG. 3 illustrates exemplary characteristics of RF frequency responses.

FIG. 3 illustrates exemplary characteristics of RF frequency responses. Magnitude of filter loss in dB is shown on the Y-axis 302. Frequency is shown on the X-axis 308. Curve 312 shows the RF characteristics of a five-element filter built with components using the prior art schematic of FIG. 1, where a flyback phenomenon is observed at higher frequencies, for example, around 11 GHz. Curve 310 shows the RF characteristics of the schematic of FIG. 2 in accordance with the present disclosure, where a flyback phenomenon is sharply reduced or no longer present. Thus, the schematic of FIG. 2 exhibits low loss and sharp roll off of the RF characteristics without the unwanted flyback phenomenon. The structure of FIG. 2 is also incredibly compact. As stated above, it provides much of the frequency response of a 5-element filter as shone with curve 312. In many cases the 5-element filter would be at least 5 times larger.

It will be understood by those skilled in the art that this technique of directly connecting a bottom output finger to the input can be used by directly connecting the top output finger to the input, instead of connecting the bottom output finger to the input.

Figure 4:
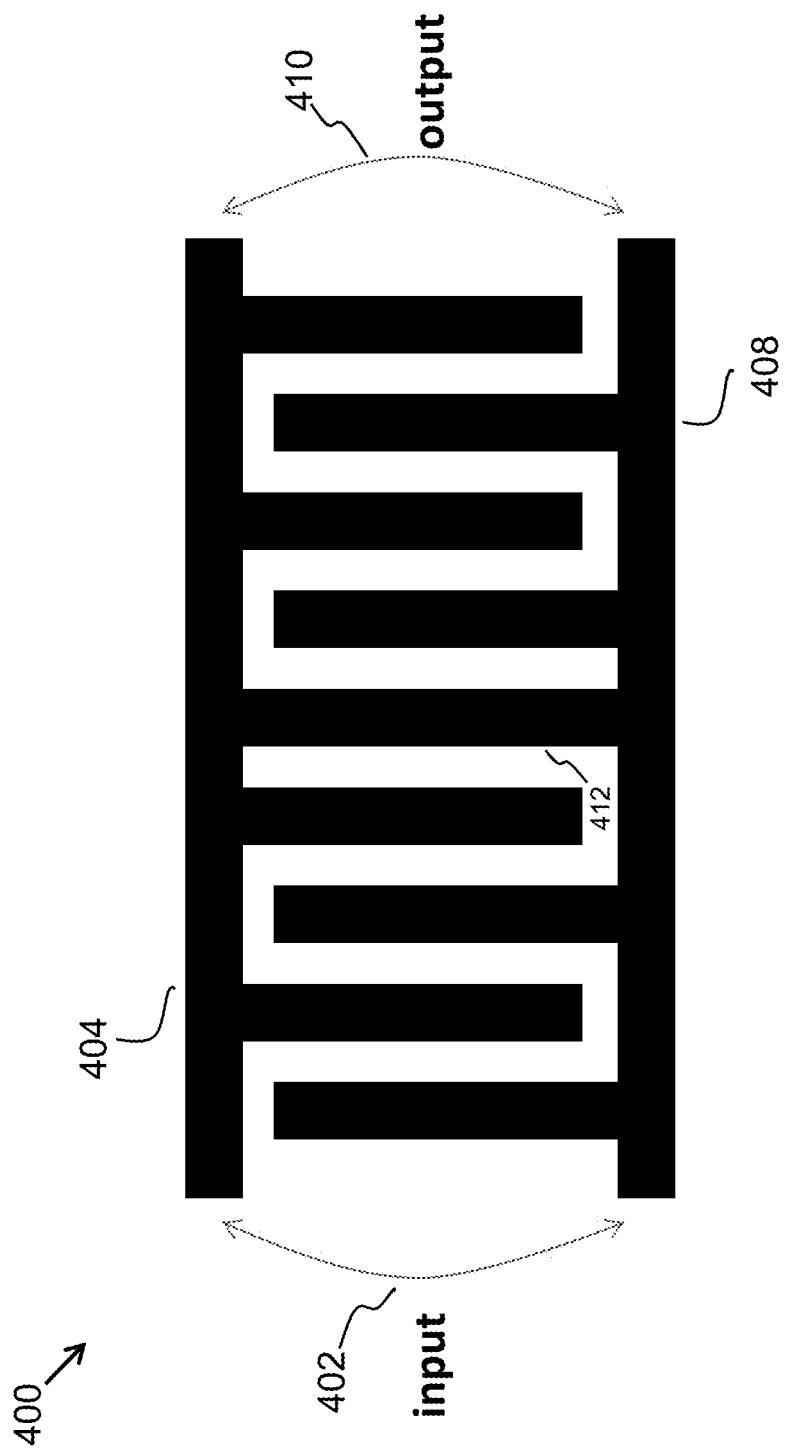
FIG. 4 shows a second exemplary layout of an interdigitated RF filter 400 according to the present disclosure, where an intermediate or middle finger 412 has been directly connected to the output between nodes 404 and 408.

Differential or balanced implementations of the filter structure are also possible. FIG. 4 shows a second exemplary layout of an interdigitated RF filter 400 according to the present disclosure, where an intermediate or middle finger 412 has been connected between nodes 404 and 408. This interdigitated RF filter has a balanced input 402 and a balanced output 410. This connection in the middle also exhibits low loss and sharp roll off of the RF characteristics without the unwanted flyback phenomenon.

Figure 5A:
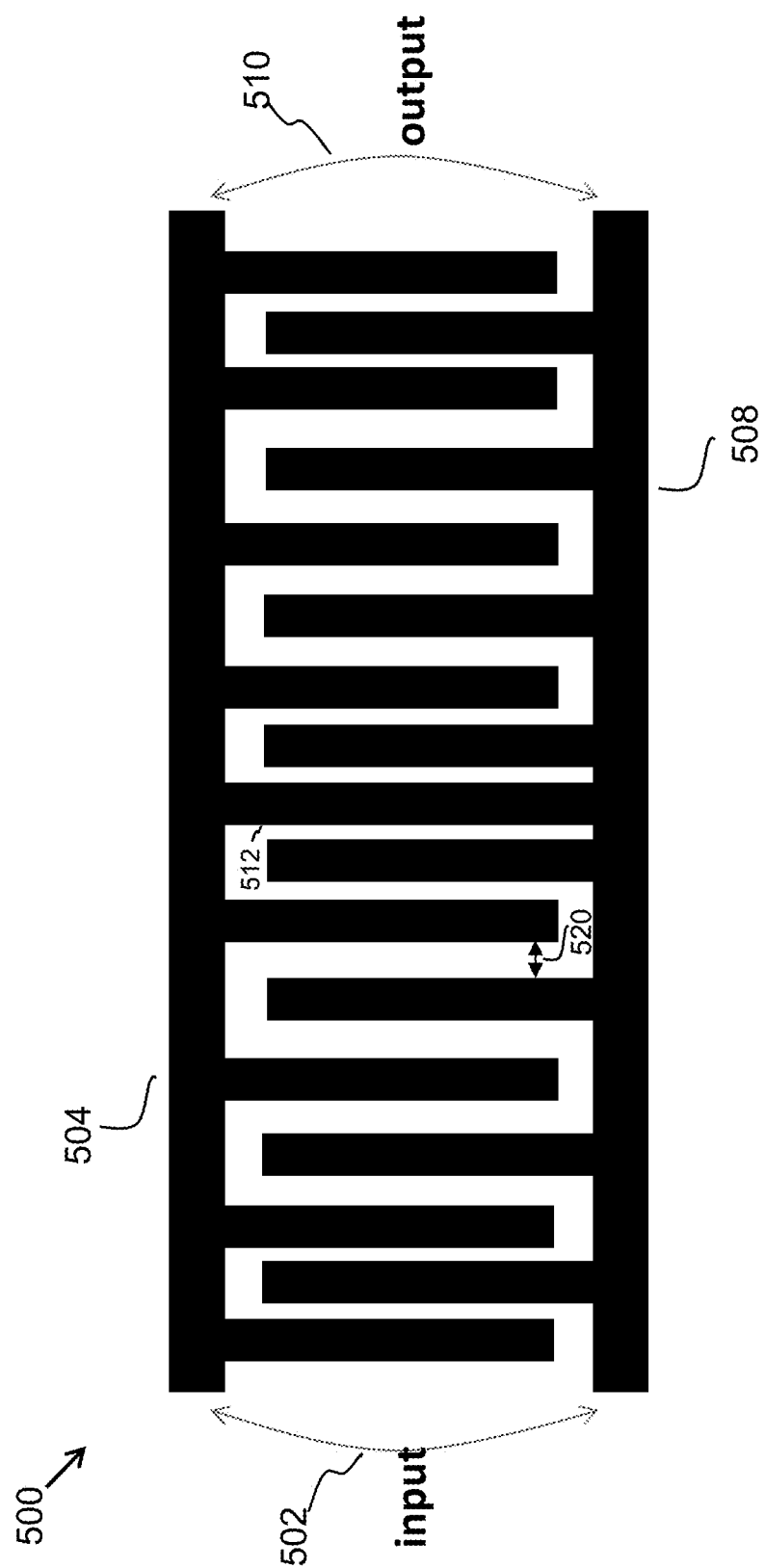
FIG. 5A shows a third exemplary layout of an interdigitated RF filter 500 according to the present disclosure, where an intermediate or middle finger 512 has been directly connected to the output between nodes 504 and 508.

FIG. 5A shows a third exemplary layout of an interdigitated RF filter 500 according to the present disclosure, where a finger 512 has been connected between nodes 504 and 508. This interdigitated RF filter has a balanced input 502 and a balanced output 510. In an interdigitated RF filter, the number of fingers, their lengths and the spacing 520 between the input fingers and the output fingers determines the RF characteristics of the filter. There are many possible ways to build these filters with various number of fingers, finger lengths, finger widths, finger spacings, location and number of shorted fingers, and so on. As an example, the finger lengths do not have to be the same length across the structure.

Figure 5B:
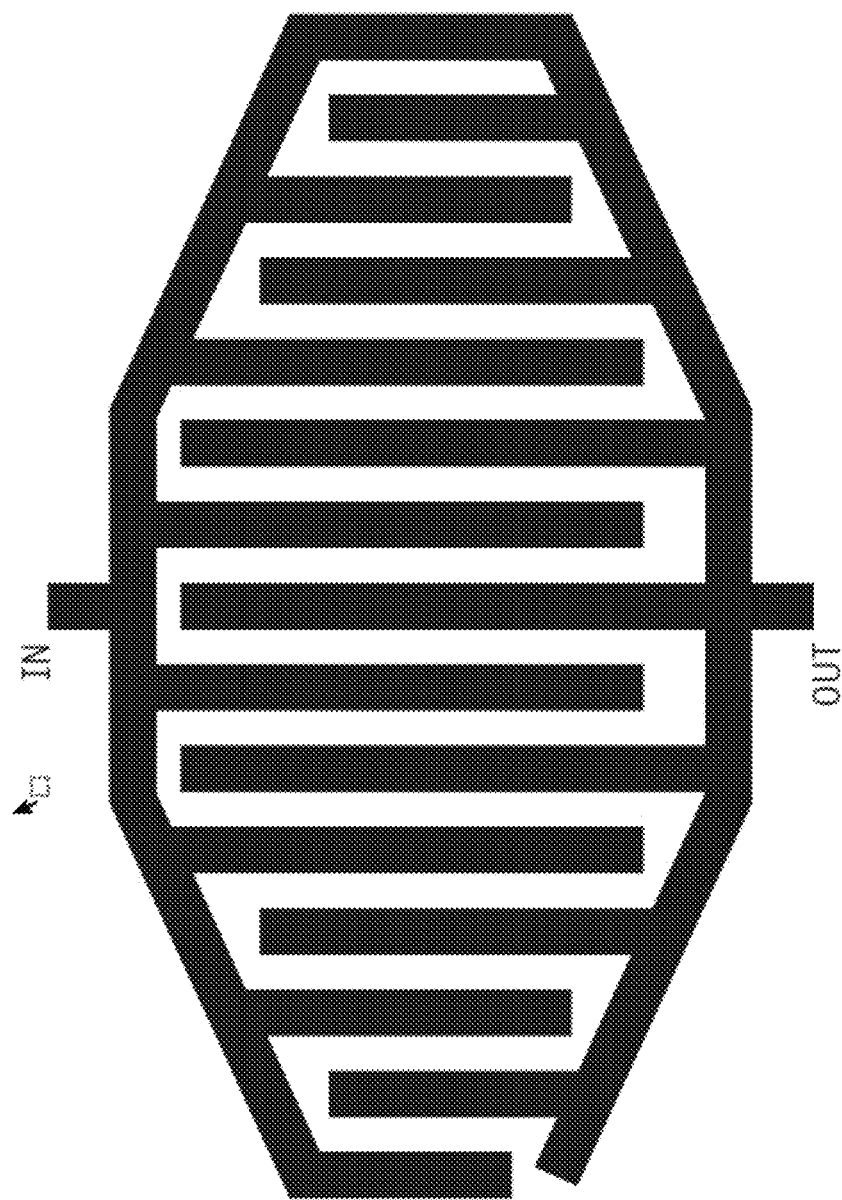
FIGS. 5B-5C show fourth and fifth exemplary layouts of an interdigitated RF filter according to the present disclosure.

FIG. 5B shows a fourth exemplary layout of an interdigitated RF filter according to the present disclosure. As shown, the structure could bulge in the middle or ends to accommodate longer fingers.

Figure 5C:
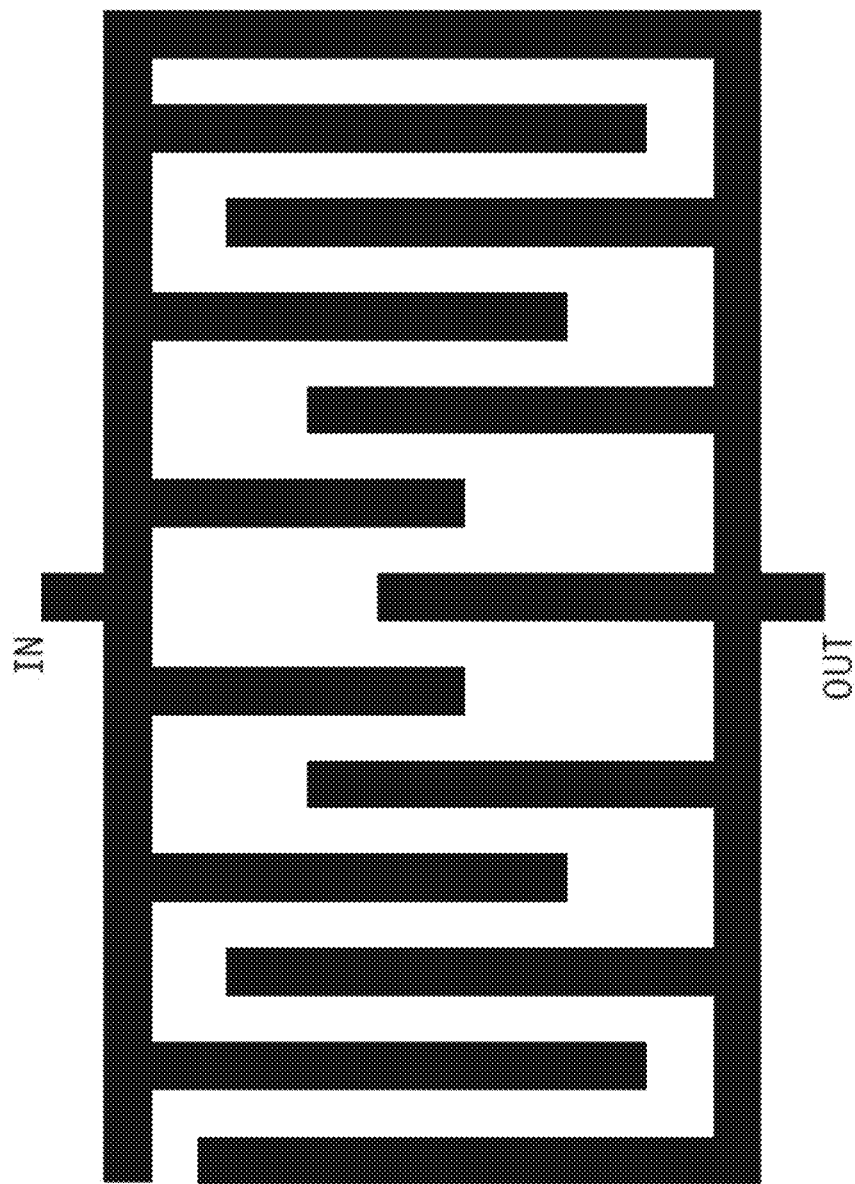

FIG. 5C shows a fifth exemplary layout of an interdigitated RF filter according to the present disclosure. As shown, the structure may stay rectangular but the fingers do not traverse the same length as you move across the structure.

Referring back to the embodiment of FIG. 5A, the spacing between some fingers is less than the spacing between other fingers. For example, a first type of spacing can range between 1 and 2 um, whereas a second type of spacing can range between 5 and 10 um. The capacitive coupling between fingers with a larger lateral spacing is less compared to the capacitive coupling between fingers with a smaller spacing. This embodiment with the connection in the middle also exhibits low loss and sharp roll off of the RF characteristics without the unwanted flyback phenomenon.

Figure 6:
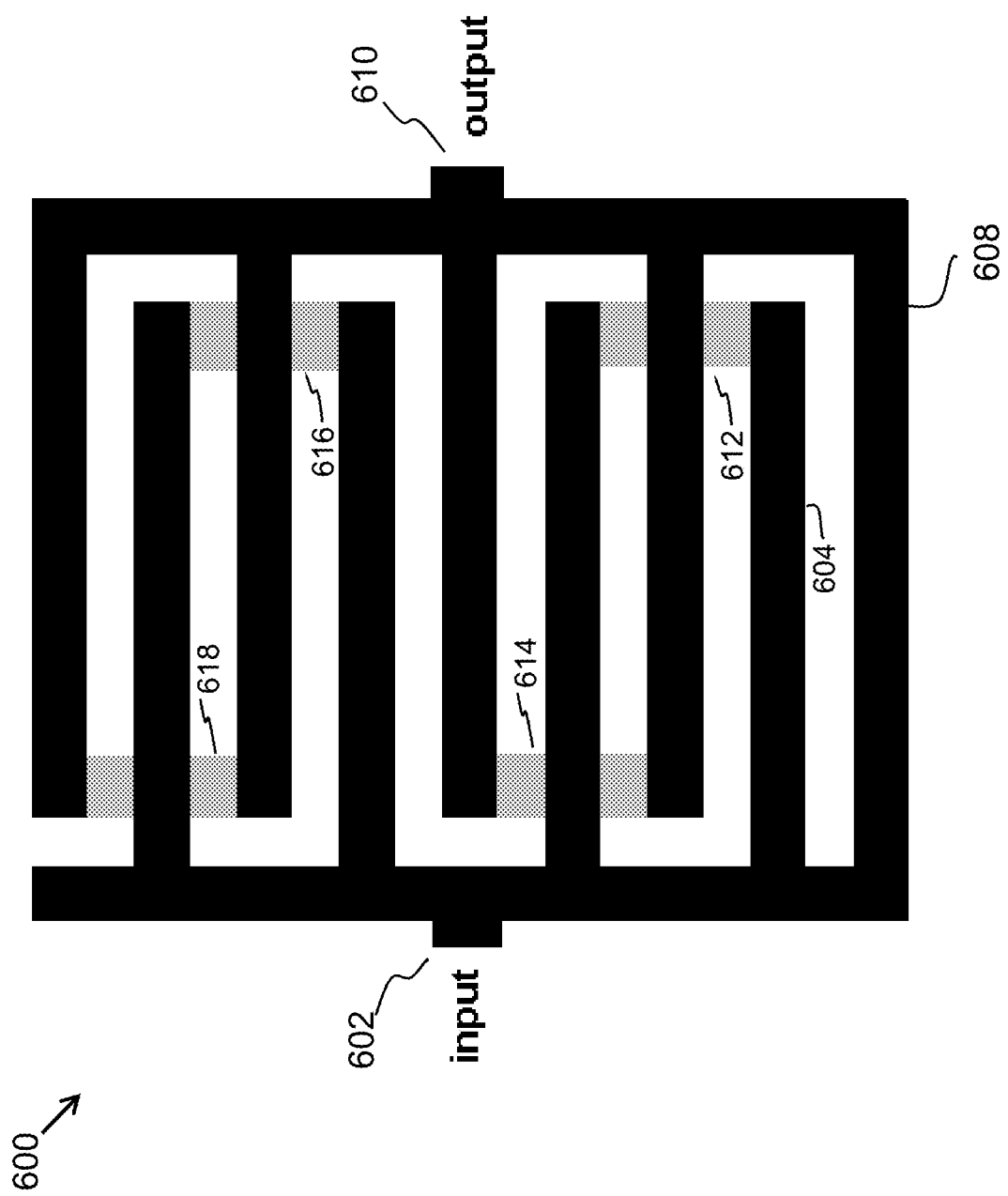
FIG. 6 shows a sixth exemplary layout of an interdigitated RF filter 600 according to the present disclosure, where an output finger 608 has been directly connected to the input.
Figure 7:
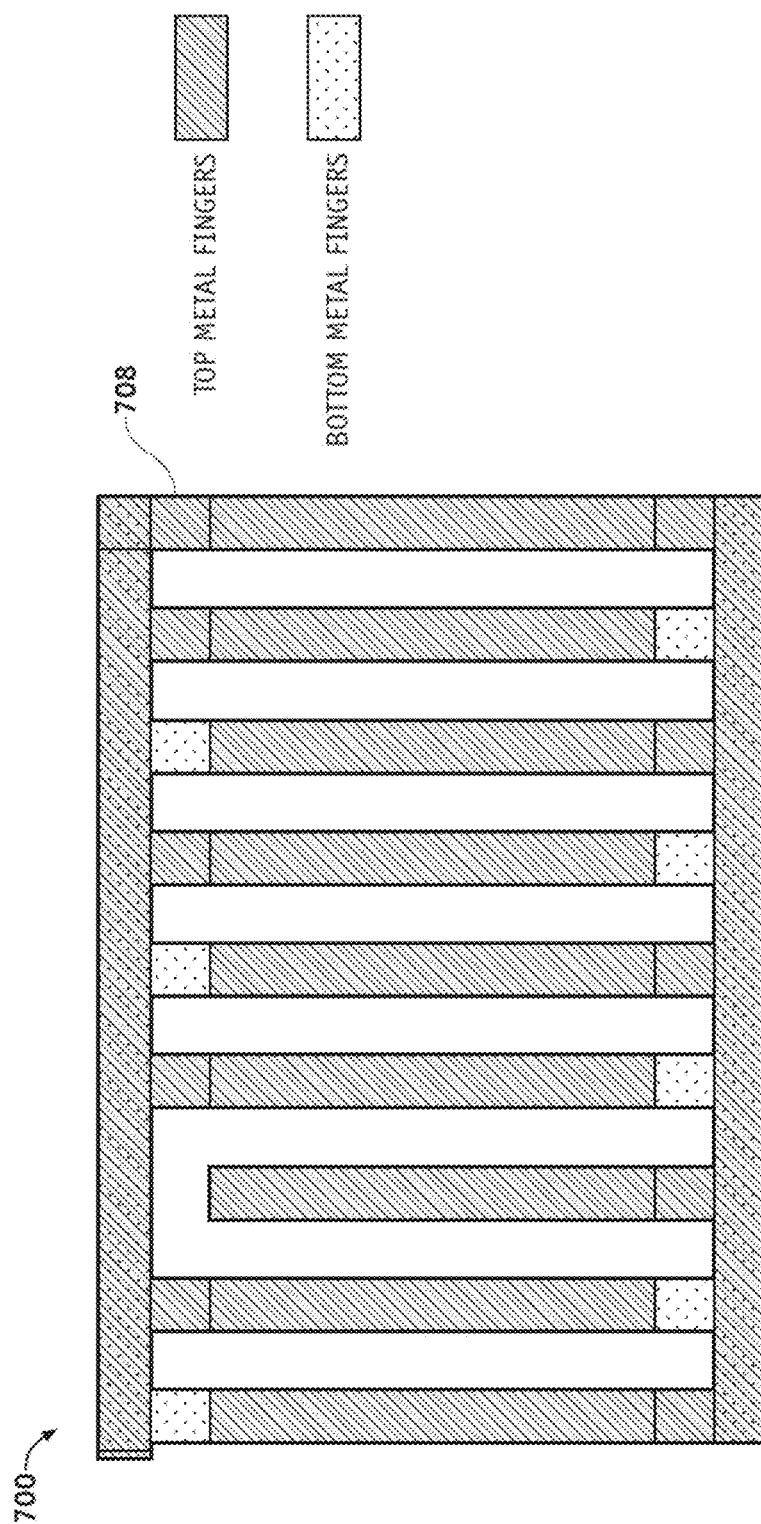
FIG. 7 shows a seventh exemplary layout of an interdigitated RF filter according to the present disclosure.

FIG. 6 shows a sixth exemplary layout of an interdigitated RF filter 600 according to the present disclosure, where an output finger 608 has been directly connected to the input. This interdigitated RF filter has an input 602 and an output 610. Additionally, in this embodiment, the ends of the input fingers have been connected to each other in another conductive layer, such as another metal layer used in an integrated circuit process, shown by reference numbers 612 and 616. The ends of the output fingers have been connected to each other in another conductive layer, such as another metal layer, shown by reference numbers 614 and 618. This embodiment also exhibits low loss and sharp roll off of the RF characteristics without the unwanted flyback phenomenon It will be understood by those skilled in the art that these interdigitated structures can be repeated on lower metal layers as is typically done in IC design to increase capacitor density for MOM capacitors. FIG. 7 shows a seventh exemplary layout of an interdigitated RF filter 700 according to the present disclosure. This exemplary layout shows that the structures can be shifted by one finger and one space or some fraction of this amount each time it is copied onto a lower layer so that the output fingers are below an input finger and the input fingers are below an output finger for increased broadside coupling. As shown in FIG. 7, shorting bar 708 is on the right side for both top and bottom fingers; however, embodiments in accordance with the teachings of the disclosure may be envisaged wherein shorting bars are on the opposite sides.

It will also be understood by those skilled in the art that a single metal layer can be used to connect the output fingers of an interdigitated capacitor to the input, whereas in other cases multiple metal layers may be used to connect the output fingers of an interdigitated capacitor to the input. It will be further understood by those skilled in the art that the approaches in accordance with the present disclosure are not limited to integrated circuits (IC), and can be employed in circuits that are built in laminate or in low temperature co-fired ceramics (LTCC).

In accordance with various embodiments of the present disclosure, interdigitated RF filters may be built wherein:
  a spacing of at least a pair of adjacent input and output fingers is different from a spacing of the other pairs of adjacent input and output fingers.
  all pairs of adjacent input and output fingers have a same spacing.
  each pair of adjacent input and output finger has a spacing that is different from the spacing of any one of the other adjacent input and output fingers.
  proceeding from an end or both ends of the RF interdigitated capacitor to a middle of the RF interdigitated capacitor, spacings of consecutive pairs of adjacent input and output fingers follow a non-increasing or a non-decreasing function.

It is understood that the above-listed features apply to all of the embodiments shown in FIGS. 2, and 4-7.

The person skilled in the art will understand that, RF interdigitated capacitors according to the present disclosure may be implemented:

- in a shunt configuration wherein a node of the output is connected to ground.
- as a resonator. It is possible to connect these resonators in a variety of more complex multi-resonator filter structures. Common approaches include multiple series resonators, multiple shunt resonators (parallel) which are typically separated from each other by another passive components, or ladder structures that include shunt and series resonators. Any combination of these interdigitated RF filters or resonators can be used to form a more complex, higher order filter.as part of an RF circuit with other passive components.
- as part of a digitally tunable capacitor (DTC) or digitally tunable inductor (DTL).
- as part of one of a i) low pass, ii) band pass, or c) high pass filter.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the presently claimed subject matter may be implemented in other transistor technologies such as bipolar, GaAs HBT, GaN HEMT, GaAs pHEMT, and MESFET technologies. The presently claimed subject matter has been shown in relation to NMOS RF switches, however the presently claimed subject matter may be implemented in relation with PMOS RF switches as well. The Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims.

What is claimed is:

1. A radio frequency (RF) interdigitated RF filter comprising:
   a plurality of input fingers made from a first metal layer and connected to an input node; and
   a plurality of output fingers made from the first metal layer and connected to an output node;
   wherein
   at least one output finger is connected to the input node through a second metal layer, and/or at least one input finger is connected to the output node through the second metal layer.

2. A digitally tunable inductor (DTL) comprising the RF interdigitated filter of claim 1.

3. The RF interdigitated filter of claim 1 wherein an outermost perimeter of a layout of the interdigitated filter has a polygonal non-rectangular shape.

4. The RF interdigitated filter of claim 3, wherein the polygonal non-rectangular shape has at least a bulging in a middle or on a side of the layout of the interdigitated filter.

5. A digitally tunable capacitor (DTC) comprising the RF interdigitated filter of claim 1.

6. The RF interdigitated filter of claim 1, wherein the at least one output finger and the at least one input finger are respectively a bottom output finger and a bottom input finger or a top output finger and a top input finger.

7. The RF interdigitated filter of claim 1, wherein a spacing of at least a pair of adjacent input and output fingers is different from a spacing of the other pairs of adjacent input and output fingers.

8. The RF interdigitated filter of claim 1, wherein all pairs of adjacent input and output fingers have a same spacing.

9. The RF interdigitated filter of claim 1, wherein each pair of adjacent input and output fingers has a spacing that is different from a spacing of any one of other adjacent input and output fingers.

10. The RF interdigitated filter of claim 1, wherein proceeding from an end or two ends of the RF interdigitated filter to a middle of the RF interdigitated filter, spacings of consecutive pairs of adjacent input and output fingers follow a non-increasing or a non-decreasing function.

11. An RF circuit comprising two or more of the RF interdigitated filters of claim 1 implemented in a multi-resonator filter structure with a) series resonators, b) parallel resonators, c) ladder configuration of resonators or a combination thereof.

12. The RF interdigitated filter of claim 1 implemented as part of an RF circuit with other passive components.

13. The RF interdigitated filter of claim 1 implemented as part of one of a i) low pass, ii) band pass, or c) high pass filter.

14. The RF interdigitated filter of claim 1 implemented in a balanced configuration.

15. The RF interdigitated filter of claim 1, wherein a finger of the plurality of input fingers or the plurality of output fingers has a length different from lengths of other fingers of the plurality of input fingers and the plurality of output fingers.

* * * * *